United States Patent [19]

Ono et al.

[11] Patent Number: 5,787,127
[45] Date of Patent: Jul. 28, 1998

[54] VITERBI DECODING METHOD AND APPARATUS WITH BALANCE AMONG MEMORY AND PROCESSING REQUIREMENTS

[75] Inventors: Shigeru Ono; Hiroshi Katsuragawa, both of Tokyo, Japan

[73] Assignee: Oki Electric Industry Co., Ltd., Tokyo, Japan

[21] Appl. No.: 684,103

[22] Filed: Jul. 22, 1996

[30] Foreign Application Priority Data

Aug. 23, 1995 [JP] Japan ................... 7-214417

[51] Int. Cl.⁶ .................. H03M 7/00; H04L 27/06
[52] U.S. Cl. .................. 375/341; 371/43.4; 371/43.7; 371/43.8
[58] Field of Search .................. 375/262, 265, 375/340, 341; 371/43.4, 43.6, 43.7, 43.8; 704/242

[56] References Cited

U.S. PATENT DOCUMENTS

| | | | |
|---|---|---|---|
| 5,291,524 | 3/1994 | Itakura et al. | 375/341 |
| 5,325,402 | 6/1994 | Ushirokawa | 375/341 |
| 5,379,306 | 1/1995 | Noma et al. | 371/43.4 |
| 5,406,570 | 4/1995 | Berrou et al. | 371/43.4 |
| 5,408,502 | 4/1995 | How | 375/340 |
| 5,436,932 | 7/1995 | Sogo et al. | 375/341 |
| 5,488,637 | 1/1996 | Jeong et al. | 375/341 |
| 5,490,178 | 2/1996 | Blaker et al. | 375/341 |
| 5,497,401 | 3/1996 | Ramaswamy et al. | 375/341 |
| 5,533,065 | 7/1996 | Blaker et al. | 375/341 |
| 5,537,445 | 7/1996 | Blaker et al. | 375/341 |
| 5,548,600 | 8/1996 | Fredrickson et al. | 371/43.4 |
| 5,559,837 | 9/1996 | Blaker et al. | 375/341 |
| 5,581,581 | 12/1996 | Sato | 375/341 |
| 5,636,251 | 6/1997 | Citta et al. | 375/341 |
| 5,651,032 | 7/1997 | Okita | 375/341 |
| 5,666,380 | 9/1997 | Sonetaka | 375/240 |
| 5,717,471 | 2/1998 | Stewart | 348/726 |

FOREIGN PATENT DOCUMENTS

WO 92/20162  11/1992  WIPO.

OTHER PUBLICATIONS

"The Viterbi Decoding Algorithm",Error–Correcting Codes, Second Edition, W. Wesley Peterson et al, The MIT Press, 1988,pp. 412–421.

H. Imai, Fugo Riron (Coding Theory), Institute of Electronics, Information, and Communication Engineers of Japan, 1990, pp. 280–312.

*Primary Examiner*—Young T. Tse
*Attorney, Agent, or Firm*—Spencer & Frank

[57] ABSTRACT

A Viterbi decoding method and apparatus employ a path memory describing paths with a length of X·N branches, where N is a fixed positive integer, and X has a fixed value not less than two. One path is selected and retraced over its X·N branches, and the least recent (X–1)·N branches are also traced forward and decoded; then the least recent (X–1)·N branches of each path in the path memory are replaced with new path information. This process is repeated up to the end of the data to be decoded.

9 Claims, 2 Drawing Sheets

VITERBI DECODING METHOD AND APPARATUS WITH BALANCE AMONG MEMORY AND PROCESSING REQUIREMENTS

BACKGROUND OF THE INVENTION

The present invention relates to an improved Viterbi decoding method for decoding a trellis code such as a convolutional code, and to a Viterbi decoding apparatus employing the improved Viterbi decoding method.

The term trellis code as used herein refers to a code generated by a finite state machine, in which input of the information to be coded causes transitions or branches among states, each branch accompanied by the output of a group of encoded symbols. In a convolutional code, the finite state machine is a shift register, and the output is produced by operations on the contents of various register stages.

The Viterbi decoding method is basically a maximum-likelihood method that maintains, in a path memory, a record of the sequence of branches, or path, by which each state is most likely to have been reached at the present time. Each time a new group of symbols is received, branch metrics are calculated for all possible branches from each state, and the most likely paths are updated on the basis of these branch metrics and existing path metrics. At the end of a received message, one path is selected and retraced, and its branches are decoded to reconstruct the original data.

One problem with the basic Viterbi method is that for long messages, a very large path memory is required to hold all the associated path information. Another problem is a long decoding delay, because decoding does not begin until the entire message has been received.

A conventional solution to both of these problems, known as path memory truncation, stores path information only for a certain number of most recent branches. Each time a new group of symbols is received, the most likely path is retraced back to its oldest stored branch; this single branch is decoded; then the oldest branches of all paths are deleted from the path memory to make space for new branches.

Conventional path memory truncation exacts a heavy processing-load penalty, because the path retracing process must be carried out every time a new group of symbols is received. A method of reducing the path memory requirement and shortening the decoding delay without incurring such a heavy processing penalty is desirable.

SUMMARY OF THE INVENTION

It is accordingly an object of the present invention to decode a trellis code by the Viterbi method with a reasonable balance among path memory requirements, decoding delay, and processing load.

The invented Viterbi decoding method begins by storing, in a path memory, path information describing one path leading back from each state. Each path described in the path memory has a length of X·N branches, where N is a fixed positive integer, and X has a fixed value not less than two.

Next, one path is selected and retraced over the X·N branches described in the path memory. The least recent (X−1)·N of these branches are also traced forward and decoded.

Further path information is then stored in the path memory, lengthening the path leading back from each state by (X−1)·N new branches. This further path information replaces the stored path information for the least recent (X−1)·N branches, so the total amount of path information stored in the path memory remains constant at X·N branches per state.

Next one path is again selected and retraced over X·N branches, and the least recent (X−1)·N of these branches are traced forward and decoded. Then further path information is again stored as described above.

Repetition of this process continues until the end of the data to be decoded is reached. At this point one path is selected and retraced back to the time following the last decoded branch, and the retraced branches are decoded.

DETAILED DESCRIPTION OF THE PREFERRED EMBODIMENTS

An embodiment of the invention will be described with reference to the attached exemplary drawings.

Figure 1:
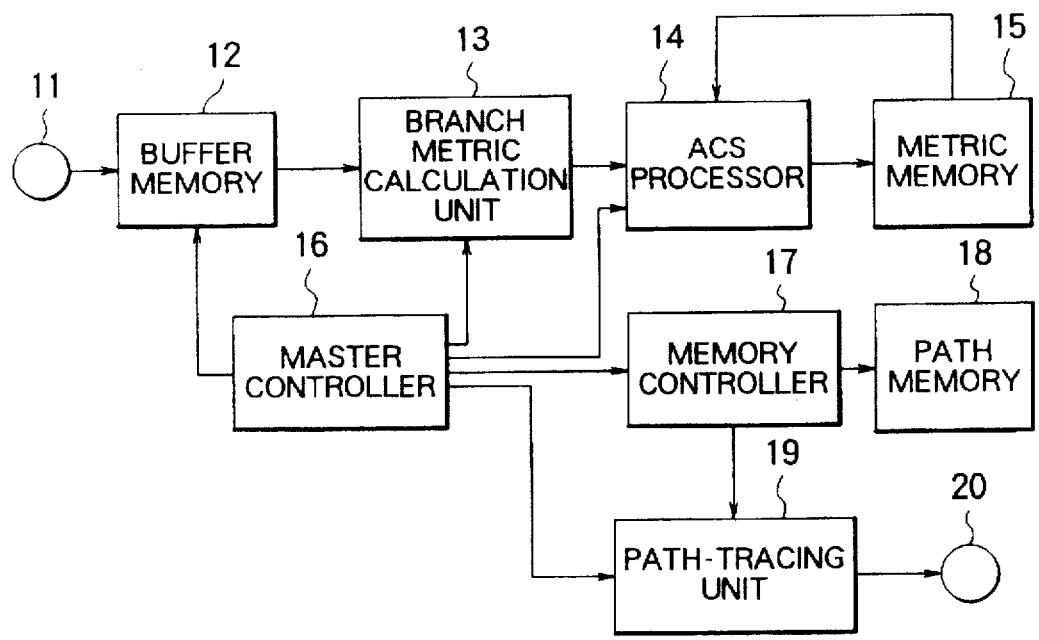
FIG. 1 is a block diagram of the invented Viterbi decoding apparatus.

Referring to FIG. 1, the invented Viterbi decoding apparatus comprises an input port 11, a buffer memory 12, a branch metric calculation unit 13, an ACS processor 14, a metric memory 15, a master controller 16, a memory controller 17, a path memory 18, a path-tracing unit 19, and an output port 20. Incidentally, ACS is an abbreviation of add-compare-select.

The input port 11 has the function of receiving the data to be decoded.

The buffer memory 12 has the function of temporarily storing the data received by the input port 11.

The branch metric calculation unit 13 has the function of calculating branch metrics, as described below.

The ACS processor 14 uses the calculated branch metrics to calculate path metrics and select one path leading back from each state.

The metric memory 15 stores the path metrics calculated by the ACS processor 14 for the selected paths.

The master controller 16 controls the operation of the branch metric calculation unit 13, ACS processor 14, memory controller 17, and path-tracing unit 19.

The memory controller 17 controls read and write access to the path memory 18.

The path memory 18 stores path information representing the paths selected by the ACS processor 14.

The path-tracing unit 19 traces a path selected by the ACS processor 14 backward, then forward, to obtain decoded data.

The output port 20 outputs the decoded data obtained by the path-tracing unit 19.

Figure 2:
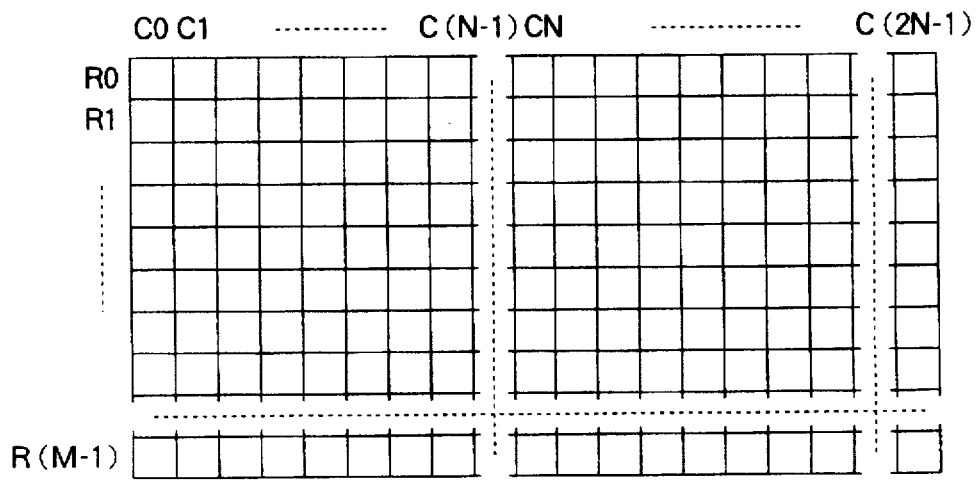
FIG. 2 shows an example of the structure of the path memory in FIG. 1.

FIG. 2 shows an example of the structure of the path memory 18.

The path memory 18 is organized as a two-dimensional array in which each memory cell is specified by a row address and a column address. The path memory in FIG. 2 is designed for a trellis code with M states, which correspond to row addresses R0 to R(M−1). The column addresses C0 to C(2N−1) correspond to the intervals at which branches take place. The letter N denotes a positive integer corresponding to a predetermined number of branches.

Detailed descriptions of the other elements in FIG. 1 will be omitted, as they comprise the same general type of computational and memory circuits as found in conventional Viterbi decoding apparatus.

Figure 3:
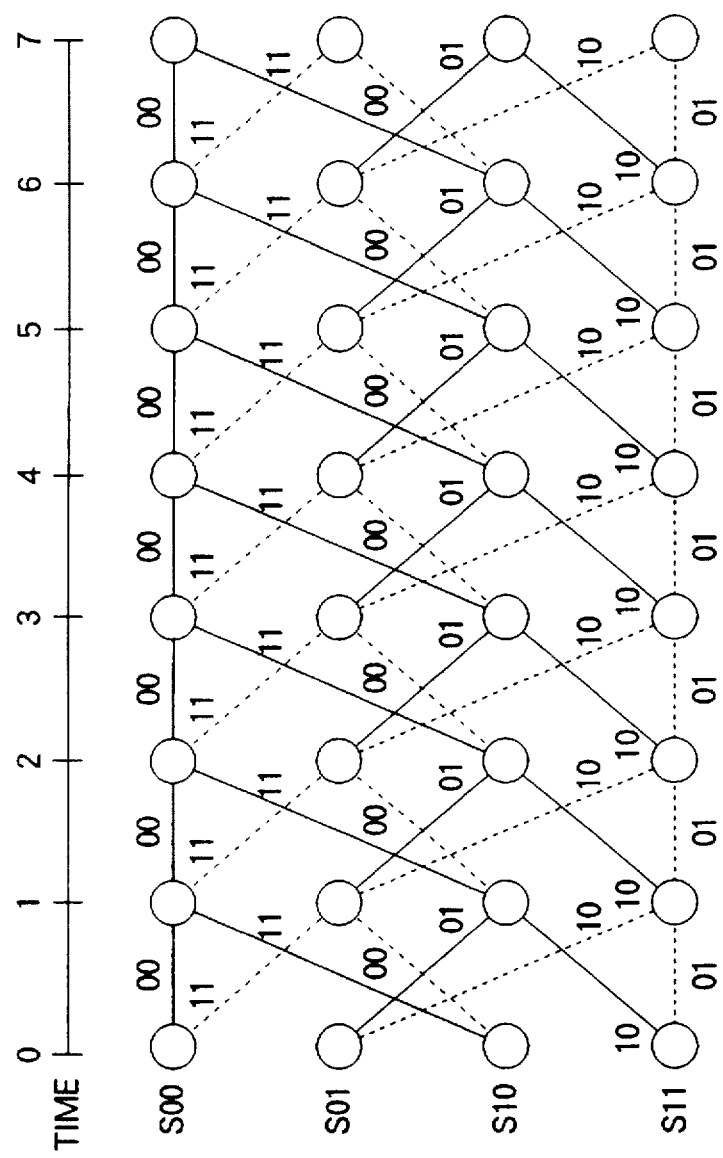
FIG. 3 shows an example of a trellis diagram.

FIG. 3 shows an example of a trellis diagram for a convolutional code. The scale at the top of FIG. 3 represents time (t). Branches occur at the times marked by consecutive integers on this scale.

The coder (not illustrated) comprises a shift register with three stages, each storing one bit of data to be coded. The contents of the first two stages define four possible states, denoted S00, S01, S10, and S11. These state names give the values of the bits stored in the first two shift-register stages: in state S00, for example, both stages hold '0' bits.

Input of a new bit to the shift register causes a state transition, or branch. The solid lines designate branches caused by input of a '0' bit; the dotted lines designate branches caused by input of a '1' bit. Each branch is accompanied by output of the indicated two-bit value. The first output bit is the modulo-two sum of the contents of the first and last shift-register stages; the second bit is the modulo-two sum of the contents of all three shift-register stages. A transition from state S00 to state S01, for example, causes output of the bit pair '11.' The output can also be described as being produced by the following pair of generator polynomials G.

$$G=[1+D^2, 1+D+D^2]$$

This convolutional code is said to have a code rate of ½ and a constraint length of three, meaning that at the coder, the input bit rate is one-half the output bit rate, and each pair of output bits is determined by the three most recent input bits. The integer N shown in FIG. 2 is preferably equal to about five or six times the constraint length, thus to about fifteen or eighteen in the present example.

Next, the operation of the invented Viterbi decoding apparatus will be described with respect to the trellis diagram in FIG. 3.

For the trellis code in FIG. 3, the data received at the input port 11 are temporarily stored in the buffer memory 12, and are supplied two bits at a time to the branch metric calculation unit 13. Let $y(t)$ denote the two bits supplied at time t, and let $y_1$ and $y_2$ be the two bit values. These two bits correspond to a branch $b(i, j)$ from a state Si at time t to a state Sj at time t+1. Let $b_1$ and $b_2$ represent the two bit values output by the coder for this transition. Note that $b_1$ and $b_2$ may differ from $y_1$ and $y_2$, due to transmission errors.

Since b1 and b2 are not known with certainty, the branch metric calculation unit 13 calculates a branch metric $d[y(t), b(i, j)]$ for each possible branch $b(i, j)$. The branch metric is, for example, the Hamming distance between the $y_1-y_2$ pair and the $b_1-b_2$ pair, calculated according to the following equation, in which XOR represents the exclusive logical OR operation.

$$d[y(t), b(i, j)] = (y_1 \text{ XOR } b_1) + (y_2 \text{ XOR } b_2)$$

If $y(t)$ is '00,' for example, then the branch metric $d[y(t), b(01, 10)]$ of the branch $b(01, 10)$ from state S01 at time t to state S10 at time t+1, which produces the $b_1-b_2$ pair '01,' is calculated as follows.

$$d[y(t), b(01, 10)] = (0 \text{ XOR } 1) + (0 \text{ XOR } 1) = 1$$

When the branch metrics have been calculated, the ACS processor 14 adds the branch metrics to the existing path metrics stored in the metric memory 15, compares the resulting sums, selects a new path entering each state, and stores information about this path in the metric memory 15 and path memory 18.

Let $d(i, t)$ denote the value stored in the metric memory 15 for the path entering state Si at time t. For the extension of that path to a path entering state Sj at time t+1, the ACS processor 14 calculates a new path metric $d(i, j, t+1)$ as follows.

$$d(i, j, t+1) = d(i, t) + d[y(t), b(i, j)]$$

After performing this calculation for a given state Sj at time t+1 and for all states Si at time t, the ACS processor 14 selects the path entering state Sj at time t+1 with the minimum path metric. This minimum path metric $d(j, t+1)$ is given as follows.

$$d(j, t+1) = \text{minimum}\{d(i, j, t+1)\} \; (i=00, 01, 10, 11)$$

If the minimum value is shared by two or more paths, an arbitrary one of these paths is selected. The selected path is referred to as a survivor, denoted $P(j, t+1)$, and is equivalent to a previous survivor $P(i, t)$ entering a state Si at time t, combined with the branch $b(i, j)$ from state Si to state Sj.

In the trellis diagram of FIG. 3, for example, there are two paths entering state S10: one path leading from state S01; the other path leading from state S11. Suppose that the path metrics $d(01, t)$ and $d(11, t)$ of the survivors entering these states S01 and S11 at time t were as follows:

$$d(01, t)=20$$

$$d(11, t)=21$$

If the data $y(t)$ are '00,' the relevant branch metrics $d[y(t), b(01, 10)]$ and $d[y(t), b(11, 10))$ are given as follows:

$$d[y(t), b(01, 10)]=(0 \text{ XOR } 0)+(0 \text{ XOR } 1)=1$$

$$d[y(t), b(11, 10)]=(0 \text{ XOR } 1)+(0 \text{ XOR } 0)=1$$

Path metrics $d(01, 10, t+1)$ and $d(11, 10, t+1)$ thus have the following values.

$$\begin{aligned} d(01, 10, t+1) &= d(01, t) + d[y(t), b(01, 10)] \\ &= 20 + 1 = 21 \\ d(11, 10, t+1) &= d(11, t) + d[y(t), b(11, 10)] \\ &= 21 + 1 = 22 \end{aligned}$$

The survivor $P(10, t+1)$ entering state S10 at time t+1 is the path passing through state S01 at time t. The path metric $d(10, t+1)$ of path $P(10, t+1)$ is denoted $d(10, t+1)$.

$$d(10, t+1)=21$$

The above process of adding branch metrics, comparing resulting path metrics, and selecting survivors will be referred to below as the ACS process. The ACS process is carried out for each state Sj at time t+1. The resulting path metrics $d(j, t+1)$ are stored in the metric memory 15, replacing the previous values $d(j, t)$. The metric memory 15 has M memory areas, and stores one path metric for each state.

For each selected survivor, the memory controller 17 also stores one bit of information in the path memory 18, describing the branch made in the interval from time t to time t+1. For the code illustrated in FIG. 3, it is convenient to store a '0' when the branch indicated by the upper line is selected, and a '1' when the branch indicated by the lower line is selected. The stored bit then corresponds directly to the value of the bit shifted out of the shift register in the coder when the branch occurred. In FIG. 2, the memory cell defined by each row-column address is a one-bit memory cell storing the value '0' or '1.'

While the ACS processor 14 is performing the ACS process for all states Sj at time t+1, the branch metric calculation unit 13 can be calculating branch metrics for the next pair of bits y(t+1) supplied from the buffer memory 12. The overall processing is controlled by the master controller 16.

After 2N pairs of bits, representing 2N branch intervals, have been processed in this way, the decoder is ready to decode the first N of these branches. The master controller 16 temporarily suspends the processes described above, the ACS processor 14 selects one path described in the path memory, and the master controller 16 commands the path-tracing unit 19 to retrace this path. The selected path is, for example, the path having the minimum metric value in the metric memory 15.

The path-tracing unit 19 retraces the selected path back from time 2N—1 to the initial time (time 0). The retracing process is carried out by accessing the path memory 18 through the memory controller 17. If path information is stored in the path memory 18 as suggested above, the bit values stored in the path memory 18 for times t and t+1 can be read as a two-bit value identifying the state at time t−1.

When the path has been retraced back to its initial state (at time 0), it is next traced forward from the initial state over N branches up to and including the branch made at time N−1, to obtain N bits of decoded data. These N bits of decoded data are output at the output port 20. If the scheme suggested above is employed, the bit values stored in the path memory 18 are themselves the decoded data.

A well-known feature of the Viterbi method is that the M survivors have a strong tendency to converge to a single path at distances of more than about five constraint lengths back from the present time. The decoded data obtained from the first N branches will thus normally be the same no matter which state was selected at time 2N—1 to start the retracing process. The retracing process may therefore be started from any state at time 2N—1.

When these N bits have been decoded, the master controller 16 commands the buffer memory 12, branch metric calculation unit 13, ACS processor 14, and memory controller 17 to resume processing. The calculation of branch metrics, the ACS process, and the storing of path information and path metrics recommence from time 2N, and continue as described above for N more branch intervals, until the path information and metrics for time 3N—1 have been stored.

The path information for times 2N to 3N—1 is stored as follows. The path information for time 2N is stored at column address C0 in the path memory 18, replacing the path information for the initial time (time 0), which is no longer needed. Similarly, path information for time 2N+1 is stored at column address C1, and path information for time 3N—1 at column address C(N−1). That is, the path memory 18 is managed as a ring buffer. The N least recent branches of each path are replaced by N new branches.

When processing of the branches made at time 3N—1 has ended, the master controller 16 temporarily suspends the generation of new path information and commands the path-tracing unit 19 to retrace a selected path of length 2N from time 3N−1 back to time N; that is, back to the time of the oldest branch that was not decoded in the previous retrace. After being thus retraced, the path is traced forward from the branch made at time N to the branch made at time 2N−1, to obtain N more bits of decoded data, which are output at the output port 20.

This process continues in a similar fashion, further retraces being made at times 4N−1, 5N−1, . . . Each retrace extends backward over 2N branches, of which the N least recent branches are decoded. Then path information for N new branches per state is stored in the path memory 18, replacing the N least recent branches of each path.

Eventually, the end of the data to be decoded will be reached. At the end-of-data point, the ACS processor 14 selects a final path and the master controller 16 commands the path-tracing unit 19 to carry out one final retrace, extending back to the time of the oldest branch that was not decoded in the previous retrace. All of the branches retraced in this final retrace are then traced forward, up to the end-of-data point, to obtain at least N more bits of decoded data, which are output at the output port 20. These final output bits may include extra bits, representing bits that have entered the shift register in the coder but have not yet been shifted out; the extra bits can be obtained from the identity of the final state.

The embodiment above can be compared as follows with a basic Viterbi decoding apparatus that carries out only a single retrace after all data have been received. In the embodiment above, in each retrace, only half of the retraced data are decoded, so the retrace processing load is doubled. The size of the path memory 18 is greatly reduced, however, because it is only necessary to store path information for 2N branch intervals (about ten or twelve constraint lengths, for example) instead of for an entire message. The decoding delay is correspondingly shortened.

The embodiment above can also be compared as follows with a Viterbi decoding apparatus employing conventional path memory truncation. Conventional path memory truncation requires only half as much path memory (for N branch intervals instead of 2N) and has a correspondingly shorter decoding delay, but whereas the embodiment above only doubles the retrace processing load, conventional path memory truncation multiplies the retrace processing load by a factor of N. If N is in the range of fifteen to eighteen branch intervals, for example, conventional path memory truncation demands about eight or nine times as much path retrace processing as in the embodiment above.

The embodiment above thus strikes a desirable balance among the conflicting variables of processing load, path memory size, and decoding delay.

The embodiment above can be modified to adjust this balance. Instead of having 2N column addresses, the path memory 18 may have X·N column addresses, where X is any number equal to or greater than two. Retraces are then performed at intervals of (X−1)·N branches. Each retrace covers a path with a length of X·N branches, of which the first (X−1)·N branches are decoded and the last N branches are left undecoded. The retrace processing load is multiplied by a factor of only X/(X−1).

X can have a non-integer value, e.g. 2.4 or 4.6. For a specific application, the value of X can be adjusted to obtain an optimal trade-off between retrace processing load on the one hand and path memory size and decoding delay on the other hand.

The value of N can also be adjusted. Larger values of N require more path memory space, but yield a lower probability of error.

The embodiment described above can be modified in further ways. The branch metric calculation process and ACS process can be carried out in parallel for the same branch interval, instead of in parallel for two consecutive branch intervals. Alternatively, the branch metric calculation process and ACS process can be serialized, instead of being carried out in parallel.

The invention is not limited to use of the Hamming distance metric. Other metrics can be used instead.

Those skilled in the art will recognize that additional variations are possible within the scope claimed below.

What is claimed is:

1. An improved Viterbi decoding method of the type that decodes a trellis code defined by branches among states, by performing branch metric calculations and an add-compare-select process at successive intervals to select one path per state at each of said intervals, the improvement comprising the steps of:

(a) storing, in a path memory, path information describing one path leading back from each state among said states, each said path having a length of X·N branches, where N is a fixed positive integer and X has a fixed value not less than two;

(b) selecting and retracing one path, having the length of X·N branches, described by the path information stored in said path memory;

(c) decoding (X–1)·N least recent branches of the path thus retraced;

(d) storing in said path memory further path information describing one path leading back from each state among said states, said further path information describing (X–1)·N new branches per path, thereby replacing existing path information stored in said path memory describing (X–1)·N least recent branches per path; and (e) repeating said steps (b), (c), and (d) until an end-of-data point is reached.

2. The improved Viterbi decoding method of claim 1, comprising the further steps of:

(f) selecting a final path described by the path information stored in said path memory, when said end-of-data point is reached;

(g) retracing said final path back to an oldest interval for which no branch has yet been decoded; and (h) decoding the branches of said final path that are thus retraced.

3. The improved Viterbi decoding method of claim 1, wherein X is equal to two.

4. The improved Viterbi decoding method of claim 1, wherein said trellis code is a convolutional code having a constraint length, and N is equal to at least five times said constraint length.

5. A Viterbi decoding apparatus for decoding a trellis code represented by branches among states, said branches defining paths in a trellis diagram, comprising:

a path memory, for storing path information describing X·N most recent branches of one path leading back from each of said states, where N is a fixed positive integer and X has a fixed value not less than two;

a path-tracing unit coupled to said path memory, for retracing a path having a length of X·N branches in said path memory, and decoding (X–1)·N least recent branches of the path thus retraced;

an add-compare-select processor coupled to said path memory, for selecting one path per state and writing corresponding path information in said path memory, until new path information describing (X–1)·N most recent branches of each path has been written, said new path information replacing path information describing (X–1)·N least recent branches, and for selecting the path retraced by said path-tracing unit; and a controller coupled to said add-compare-select processor, for causing said add-compare-select processor and said path-tracing unit to operate alternately, thereby decoding said trellis code (X—).N branches at a time.

6. The Viterbi decoding apparatus of claim 5, wherein said controller initially causes said add-compare-select processor to store path information describing X·N branches of each path.

7. The Viterbi decoding apparatus of claim 5 wherein, when an end-of-data point is reached, said add-compare-select processor selects a final path, and said controller causes said path-tracing unit to retrace and decode all branches of said final path, from a branch following a last decoded branch to said end-of-data point.

8. The Viterbi decoding apparatus of claim 5, wherein X is equal to two.

9. The Viterbi decoding apparatus of claim 5, wherein said trellis code is a convolutional code having a constraint length, and N is equal to at least five times said constraint length.

* * * * *